(12) United States Patent
Lee et al.

(10) Patent No.: US 10,868,249 B2
(45) Date of Patent: Dec. 15, 2020

(54) CHALCOGENIDE MATERIAL AND ELECTRONIC DEVICE INCLUDING THE SAME

(71) Applicant: SK hynix Inc., Icheon (KR)

(72) Inventors: Woo-Tae Lee, Seoul (KR); Gwang-Sun Jung, Icheon (KR); Tae-Hoon Kim, Seongnam (KR); Sang-Hyun Ban, Icheon (KR); Beom-Seok Lee, Icheon (KR); Uk Hwang, Gwangju (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 16/412,273

(22) Filed: May 14, 2019

(65) Prior Publication Data

US 2020/0058870 A1 Feb. 20, 2020

(30) Foreign Application Priority Data

Aug. 20, 2018 (KR) ........................ 10-2018-0096778

(51) Int. Cl.
*C01G 28/00* (2006.01)
*H01L 45/00* (2006.01)

(52) U.S. Cl.
CPC .......... *H01L 45/143* (2013.01); *C01G 28/002* (2013.01); *H01L 45/1253* (2013.01); *C01P 2006/40* (2013.01)

(58) Field of Classification Search
CPC ... H01L 45/143; H01L 45/1253; H01L 45/04; H01L 45/1233; H01L 27/2463; H01L 27/2427; C01G 28/002; C01P 2006/40; C01B 19/002; C01B 19/00
See application file for complete search history.

(56) References Cited

U.S. PATENT DOCUMENTS

| | | | |
|---|---|---|---|
| 8,148,707 B2 | 4/2012 | Ovshinsky et al. | |
| 8,642,985 B2 | 2/2014 | Chen et al. | |
| 9,379,321 B1* | 6/2016 | Chang | C03C 3/04 |
| 2007/0247899 A1* | 10/2007 | Gordon | G11C 13/0004 |
| | | | 365/163 |

FOREIGN PATENT DOCUMENTS

| | | |
|---|---|---|
| KR | 20160112938 A | 9/2016 |
| KR | 20200021254 A | 2/2020 |

* cited by examiner

*Primary Examiner* — Edward Chin

(57) ABSTRACT

A chalcogenide material and an electronic device are provided. The chalcogenide material may include 0.1-5 atomic percent (at %) of silicon, 15-22 at % of germanium, 30-35 at % of arsenic and 40-50 at % of selenium. The electronic device may include a semiconductor memory device, the semiconductor memory device including a first memory cell that includes a first switching element. The first switching element may include a chalcogenide material including 0.1-5 atomic percent (at %) of silicon, 15-22 at % of germanium, 30-35 at % of arsenic, and 40-50 at % of selenium.

20 Claims, 11 Drawing Sheets

CHALCOGENIDE MATERIAL AND ELECTRONIC DEVICE INCLUDING THE SAME

CROSS-REFERENCE TO RELATED APPLICATION

This patent document claims priority to Korean Patent Application No. 10-2018-0096778, entitled "CHALCOGENIDE MATERIAL AND ELECTRONIC DEVICE INCLUDING THE SAME" and filed on Aug. 20, 2018, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a switching characteristic between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory (or semiconductor memory device) which can improve characteristics of a selection element.

In one aspect, a chalcogenide material may include 0.1-5 atomic percent (at %) of silicon, 15-22 at % of germanium, 30-35 at % of arsenic, and 40-50 at % of selenium.

Implementations of the above chalcogenide material may include one or more the following.

Content of silicon may be 0.5-4 at %. Content of germanium may be 17-20 at %. Content of arsenic may be 31-34 at %. Content of selenium may be 43-48 at %.

In another aspect, an electronic device may include a switching element including a chalcogenide material, the chalcogenide material including 0.1-5 atomic percent (at %) of silicon, 15-22 at % of germanium, 30-35 at % of arsenic, and 40-50 at % of selenium; a first electrode electrically coupled to the switching element; and a second electrode electrically coupled to the switching element.

Implementations of the above electronic device may include one or more the following.

The content of silicon may be 0.5-4 at %. The content of germanium may be 17-20 at %. The content of arsenic may be 31-34 at %. The content of selenium may be 43-48 at %.

A further another aspect, an electronic device may include a semiconductor memory device wherein the semiconductor memory device may include a first memory cell that includes a first switching element, wherein the first switching element may include a chalcogenide material including 0.1-5 atomic percent (at %) of silicon, 15-22 at % of germanium, 30-35 at % of arsenic, and 40-50 at % of selenium.

Implementations of the above electronic device may include one or more the following.

The semiconductor memory device may further include a second memory cell including a second switching element, the second switching element having a chalcogenide material including 0.1-5 atomic percent (at %) of silicon, 15-22 at % of germanium, 30-35 at % of arsenic, and 40-50 at % of selenium, and the first memory cell and the second memory cell may further include a first memory layer and a second memory layer, respectively, each of the first and second memory layers switching between different resistance states according to a voltage or a current applied thereto. The first switching element and the second switching element may control access to the first memory layer and the second memory layer, respectively. The semiconductor memory device may include a plurality of memory cells including the first memory cell, the semiconductor memory device may further include: a plurality of first lines disposed between a substrate and the plurality of memory cells, each of the plurality of first lines extending in a first direction; and a plurality of second lines disposed over the plurality of memory cells, each of the plurality of second lines extending in a second direction that crosses the first direction, and wherein the plurality of memory cells are disposed at respective intersections of the first lines and the second lines. The semiconductor memory device may further include a capping layer disposed over at least side surfaces of the first memory cell. Content of silicon may be 0.5-4 at %. Content of germanium may be 17-20 at %. Content of arsenic may be 31-34 at %. Content of selenium may be 43-48 at %.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In still further another aspect, an electronic device may include a semiconductor memory device, wherein the semiconductor memory device may include: a substrate; a plurality of first lines disposed over the substrate and each extending in a first direction; a plurality of second lines extending in a second direction that crosses the first direction; and a plurality of memory cells disposed at respective intersections of the plurality of first lines and the plurality of second lines, wherein each of the plurality of the memory cells may include: a variable resistance layer switching between different resistance states according to a voltage or a current applied thereto; and a selection element layer controlling access to the variable resistance layer, and wherein the selection element layer may include a chalcogenide material including 0.1-5 atomic percent (at %) of silicon, 15-22 at % of germanium, 30-35 at % of arsenic and 40-50 at % of selenium.

Implementations of the above method may include one or more the following.

The variable resistance layer may include any one of a metal oxide, a phase change material, a ferroelectric material, a ferromagnetic material, and a combination thereof. The selection element layer may have either one of a single-layered structure and a multi-layered structure. Each of the plurality of memory cells may further include: a lower electrode layer coupled to a lowermost portion of each of the plurality of memory cells and functioning as a transmission path of a voltage or a current between a corresponding one of the plurality of first lines and a portion other than the lowermost portion of each of the memory cells; a middle electrode layer physically separating the selection element layer from the variable resistance layer and electrically coupling the selection element layer to the variable resistance layer; and an upper electrode layer coupled to an uppermost portion of each of the memory cells and functioning as a transmission path of a voltage or a current between a corresponding one of the plurality of second lines and a portion other than the uppermost portion of each of the memory cells. The semiconductor memory device may further include a capping layer disposed over at least side surfaces of the plurality of memory cells. Content of silicon may be 0.5-4 at %. Content of germanium may be 17-20 at %. Content of arsenic may be 31-34 at %. Content of selenium may be 43-48 at %.

These and other aspects, implementations and associated advantages are described in greater detail in the drawings, the description and the claims.

DETAILED DESCRIPTION

Figure 1:
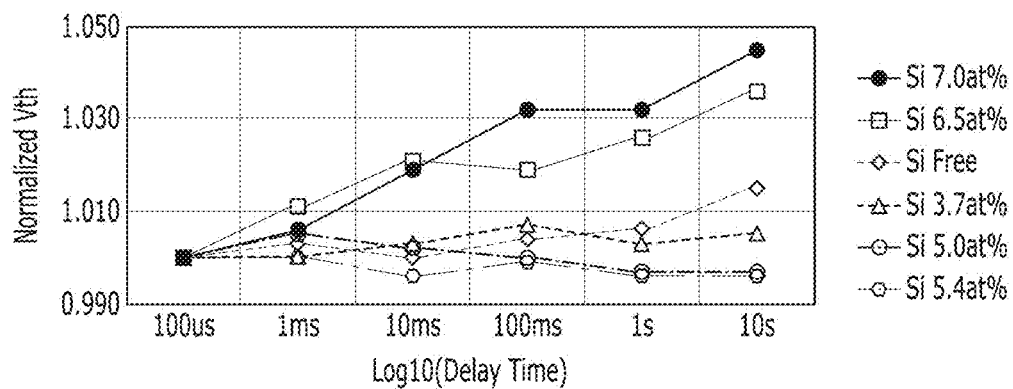
FIG. 1 illustrates voltage drift according to Si content in a chalcogenide material in accordance with an implementation of the disclosed technology.

Various examples and implementations of the disclosed technology are described below in detail with reference to the accompanying drawings.

The drawings may not be necessarily to scale and in some instances, proportions of at least some of substrates in the drawings may have been exaggerated to illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible.

In accordance with implementations of the present disclosure, a chalcogenide material which is useful for a switching element may be provided. A chalcogenide is a chemical compound consisting of at least one chalcogen anion and one or more electropositive materials. The chalcogenide material may be used as a phase change material or a switching element depending on a combination of constituent elements and the contents thereof.

In an implementation of the disclosed technology, a chalcogenide material may include 0.1-5 atomic percent (at %) of silicon (Si), 15-22 at % of germanium (Ge), 30-35 at % of arsenic (As), and 40-50 at % of selenium (Se). In another implementation of the disclosed technology, a chalcogenide material may include 0.5-4 at % of silicon (Si), 17-20 at % of germanium (Ge), 31-34 at % of arsenic (As), and 43-48 at % of selenium (Se). In further another implementation of the disclosed technology, a chalcogenide material may include about 2.0 at % (e.g., 1.9-2.1 at %, 1.95-2.05 at %, 1.97-2.03 at %, or 1.99-2.01 at %) of silicon (Si), about 18.0 at % (e.g., 17.9-18.1 at %, 17.95-18.05 at %, 17.97-18.03 at %, or 17.99-18.01 at %) of germanium (Ge), about 32.0 at % (e.g., 31.9-32.1 at %, 31.95-32.05 at %, 31.97-32.03 at %, or 31.99-32.01 at %) of arsenic (As) and about 48.0 at % (e.g., 47.9-48.1 at %, 47.95-48.05 at %, 47.97-48.03 at %, or 47.99-48.01 at %) of selenium (Se).

In implementations of the disclosed technology, each constituent element and its content in the chalcogenide material may be selected such that an electronic device including the chalcogenide material can exhibit overall optimal effects in terms of voltage drift, a threshold voltage (Vth), an off current (Ioff), Vth distribution, endurance, and the like. Although it is possible to improve an individual characteristic among the above characteristics by suitably selecting any one constituent element and its content, other characteristics can be deteriorated. Therefore, it is desirable to select optimum constituent elements and adjust their contents, which can lead to the optimum effect in consideration of the above characteristics together. In implementations of the disclosed technology, each constituent element and its content contained in the chalcogenide material may be determined in consideration of balancing various aspects of the device performances.

In the chalcogenide material, silicon (Si) and germanium (Ge) may affect voltage drift (or threshold voltage drift). The voltage drift may represent a change in a threshold voltage (Vth) of a selection element according to a delay time (or a device delay time) of a device that includes the selection element. For example, the device delay time is a delay between an input pulse applied to a first end of the device and an output pulse generated at a second end of the device in response to the input pulse, the device including the selection element and a variable resistance element that are coupled to each other in series. As a value indicating the voltage drift is decreased, the device can exhibit better characteristics. For example, if the device according to an implementation has a difference between a first threshold voltage at a first device delay time and a second threshold voltage at a second device delay time and the difference is smaller than that of a conventional device, the device performs better than the conventional device. When the device delay time is relatively short, for example, the device delay time of 100 ms or less, germanium (Ge) may significantly affect reduction in the voltage drift. However, when the device delay time is relatively long, for example, the device delay time of 100 ms or more, germanium (Ge) may hardly affect the voltage drift reduction. As a result, a drift acceleration tendency, which is a phenomenon that a Vth increase accelerates according to the device delay time, may occur. For example, a first increase in the threshold voltage Vth during a first device delay time interval may be greater than a second increase in the threshold voltage Vth during a second device delay time interval that precedes the first device delay time interval. In order to address these issues, silicon (Si) may be added to decrease a degree of the voltage drift acceleration when the device delay time is relatively long. However, the degree of voltage drift acceleration may not be decreased in proportion to an increased amount of the silicon (Si) content. Rather, when the silicon (Si) content is increased, other device characteristics may be deteriorated. Therefore, the silicon (Si) content may be determined in such a range as to decrease deterioration of other device characteristics while reducing the voltage drift, as will be explained below in more detail with reference to FIGS. 1 to 7.

Six materials shown in FIGS. 1 to 7 have the following composition, respectively:

Material 1: Si 0 at %, Ge 18.5 at %, As 29.7 at %, and Se 51.8 at %;
Material 2: Si 3.7 at %, Ge 14.1 at %, As 31.7 at %, and Se 50.5 at %;
Material 3: Si 5.0 at %, Ge 14.8 at %, As 31.8 at %, and Se 48.4 at %;
Material 4: Si 5.4 at %, Ge 16.1 at %, As 33.5 at %, and Se 45.0 at %;
Material 5: Si 6.5 at %, Ge 17.3 at %, As 34.5 at %, and Se 41.7 at %; and
Material 6: Si 7.0 at %, Ge 18.0 at %, As 33.2 at %, and Se 41.8 at %.

Referring to FIG. 1, the effect of the silicon (Si) content in a chalcogenide material on voltage drift of a threshold voltage (Vth) according to a device delay time will be explained.

FIG. 1 illustrates voltage drift of the threshold voltage according to the Si content in a chalcogenide material in accordance with an implementation of the disclosed technology. In FIG. 1, the vertical axis represents a normalized Vth value and the horizontal axis represents a device delay time expressed in a logarithmic scale (e.g., a log-10 scale). For example, normalized Vth values of a selection element including the chalcogenide material with specific composition in FIG. 1 are respective threshold voltages that are normalized by a threshold voltage of the selection element with the specific composition at a device delay time of 100 µs.

Referring to FIG. 1, when the device delay time is shorter than 100 ms, a material (e.g., Material 1) containing no silicon (Si) and materials (e.g., Materials M2, M3, and M4) containing 5.4 at % or less of silicon (Si) have similar trends in a Vth change (or voltage drift). However, when the device delay time is longer than 100 ms, the material containing no silicon (Si) tends to accelerate the Vth change, while the materials containing 5.4 at % or less of silicon (Si) do not substantially accelerate the Vth change. For example, a Vth increase of Material 1 that does not include silicon (Si) during a first device delay time interval (e.g., from 1 s to 10 s) is greater than that during a second device delay time interval (e.g., from 10 ms to 100 ms), while a Vth increase of Material 2 that includes 3.7 at % of silicon (Si) during the first device delay time interval is not significantly different from that during the second device delay time interval. Meanwhile, when the silicon (Si) content is 6.5 at % or more, the voltage drift is not substantially accelerated, however, the voltage drift value itself is significantly increased due to the excessive silicon (Si) content. For example, a Vth increase of Material 6 that includes 7.0 at % of silicon (Si) during the first device delay time interval (e.g., from 1 s to 10 s) is not significantly different from that during the second device delay time interval (e.g., from 10 ms to 100 ms), while the Vth increase of Material 6 during the first second device delay time interval or the second device delay time interval is relatively large. When the silicon (Si) content is 5.4 at %, the voltage drift may be decreased, but other device characteristics may be deteriorated. Accordingly, the silicon (Si) content may be selected to result in the optimum effect by balancing overall characteristics in consideration of inhibiting the voltage drift acceleration and obtaining other desirable device characteristics.

Figure 2:
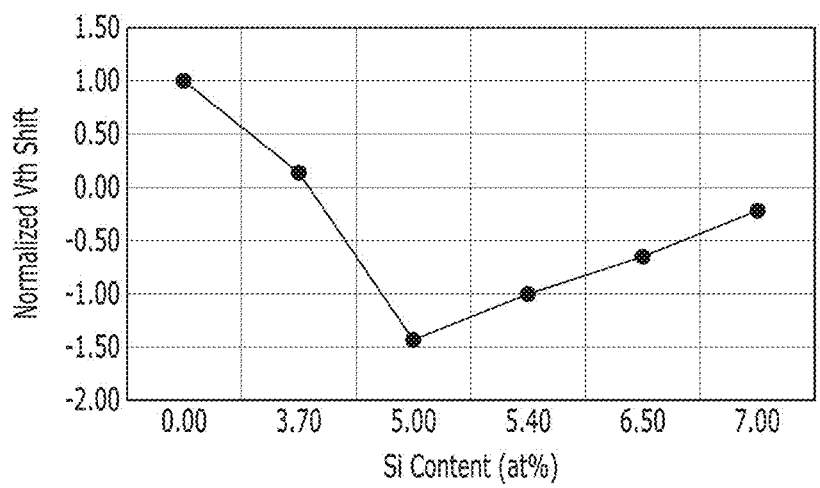
FIG. 2 illustrates a normalized drifted threshold voltage according to Si content in a chalcogenide material in accordance with an implementation of the disclosed technology.

In order to determine the optimum silicon (Si) content, at the device delay time of 100 ms or more, a threshold voltage (Vth) shift is measured to represent the voltage drift acceleration according to the silicon (Si) content. The results are shown in FIG. 2. In FIG. 2, the device delay time is based on 5 decades at the start of 100 μs and the voltage drift acceleration is represented by the normalized Vth shift value. FIG. 2 illustrates a drifted threshold voltage according to the Si content in a chalcogenide material in accordance with an implementation of the disclosed technology. In FIG. 2, magnitudes of the voltage shift (drifted threshold voltage) at the Si content of 0 at %, 3.7 at %, 5.0 at %, 5.4 at %, 6.5 at % and 7.0 at % are each normalized by a magnitude of the voltage shift (drifted threshold voltage) at the Si content of 0 at %. In FIG. 2, the vertical axis represents a normalized Vth shift value and the horizontal axis represents the silicon (Si) content.

Referring to FIG. 2, it is shown that the Vth shift is markedly decreased at the device delay time of 100 ms or more by increasing the content of silicon (Si). Addition of silicon (Si) may decrease the Vth shift, but the Vth shift may not be decreased proportionally to the content of the added silicon (Si). When the silicon (Si) content exceeds 5.0 at %, the voltage drift acceleration can be substantially inhibited, but the voltage drift value itself is increased, thereby increasing the amount of the Vth shift and deteriorating other device characteristics. Therefore, the silicon (Si) content may be selected to result in the optimum effect and balance the overall characteristics in consideration of inhibiting the voltage drift acceleration and obtaining other desirable device characteristics.

With reference to FIGS. 3 to 7, it will be explained that when the silicon (Si) content is increased, deterioration of one or more other device characteristics may occur.

Figure 3:
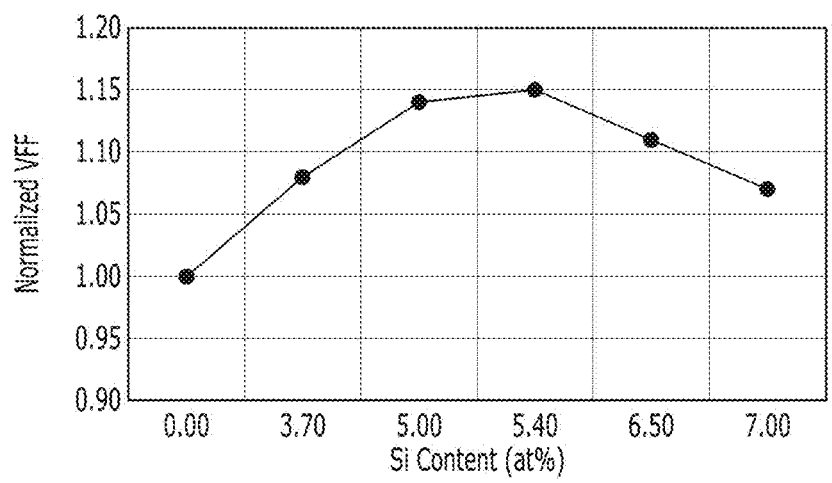
FIG. 3 illustrates a normalized voltage (VFF) according to Si content in a chalcogenide material in accordance with an implementation of the disclosed technology.

FIG. 3 illustrates a normalized voltage (VFF) according to the Si content in a chalcogenide material in accordance with an implementation of the disclosed technology. In FIG. 3, the vertical axis represents the normalized voltage VFF and the horizontal axis represents the silicon (Si) content.

Figure 4:
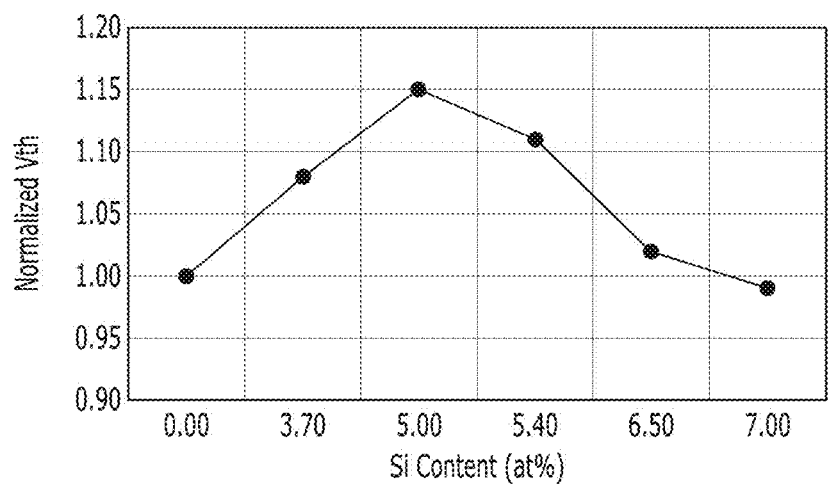
FIG. 4 illustrates a normalized threshold voltage (Vth) according to the Si content in a chalcogenide material in accordance with an implementation of the disclosed technology.

FIG. 4 is a graph showing a normalized threshold voltage (Vth) according to the Si content in a chalcogenide material in accordance with an implementation of the disclosed technology. In FIG. 4, the vertical axis is the normalized Vth and the horizontal axis represents the silicon (Si) content.

The VFF may represent a voltage which corresponds to an electrical potential sufficiently high to cause a selection element to switch before operating the selection element. The VFF may refer to a Vth which appears first. For example, the VFF can be regarded as an initial threshold voltage of the selection element and subsequent threshold voltages of the selection element during a normal operation of the selection element may be lower than the initial threshold voltage. A value (e.g., a level) of the VFF may be determined based on a bulk resistance and an interfacial resistance. For example, the interfacial resistance refers to an electrical contact resistance at an interface between the selection element and an electrode to which the VFF is applied. As the interfacial resistance is decreased, the value of the VFF may become close to a value (e.g., a level) of the Vth. As a difference between the VFF and the Vth is decreased, the device exhibit better characteristics.

Referring to FIGS. 3 and 4, when the silicon (Si) content is excessively large, for example, the silicon (Si) content exceeds 5.0 at %, the difference between the VFF and the Vth is increased. Moreover, when the silicon (Si) content exceeds 5.0 at %, the Vth may be decreased, and thus a thickness of the selection element that functions as a switching element may be significantly increased to obtain a desired value of the Vth for the switching element.

As shown in FIGS. 3 and 4, it can be found that, when the silicon (Si) content is excessively large, for example, the silicon (Si) content exceeds 5.0 at %, the device characteristics associated with the VFF and the Vth may be deteriorated.

Figure 5:
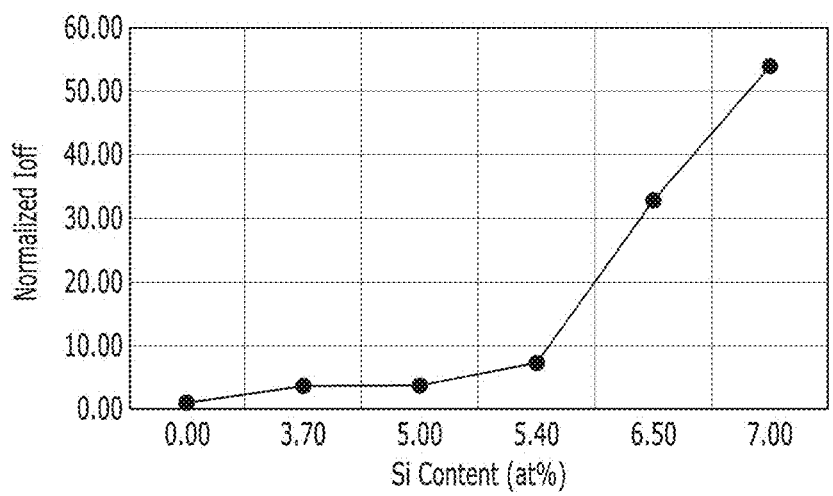
FIG. 5 illustrates an off current (Ioff) according to Si content in a chalcogenide material in accordance with an implementation of the disclosed technology.

FIG. 5 illustrates an off current (Ioff) according to the Si content in a chalcogenide material in accordance with an implementation of the disclosed technology. In FIG. 5, the vertical axis represents a normalized off current (Ioff) and the horizontal axis represents the Si content. For example, magnitudes of the off current (Ioff) at the Si content of 0 at %, 3.7 at %, 5.0 at %, 5.4 at %, 6.5 at %, and 7.0 at % are each normalized by a magnitude of the off current (Ioff) at the Si content of 0 at %.

Figure 6:
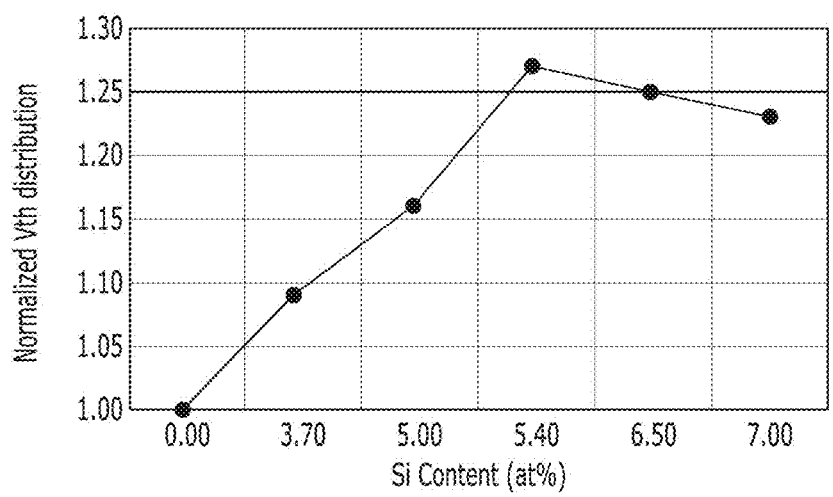
FIG. 6 illustrates a normalized threshold voltage (Vth) distribution according to Si content in a chalcogenide material in accordance with an implementation of the disclosed technology.

FIG. 6 illustrates a normalized threshold voltage (Vth) distribution according to the Si content in a chalcogenide material in accordance with an implementation of the disclosed technology. In FIG. 6, the vertical axis represents the normalized Vth distribution and the horizontal axis represents the Si content.

The off current (Ioff) may refer to an electric current in an off state and affect a sneak current. The sneak current may refer to an electric current that flows in one or more paths other than a desirable path. For example, the sneak current may include a current flowing through an unselected memory cell, rather than a selected memory cell. In most cases, the sneak current may be undesirable, because, for example, the sneak current may cause read margin degradation and increase power consumption. When the off current is increased, the sneak current is also increased, and thus it may be desirable to decrease the off current in order to improve the device characteristics.

The Vth distribution may represent a degree of change in the Vth according to repeated measurements of the Vth. For example, a value of the Vth distribution may be a variance of threshold voltages in a plurality of switching elements after a given number of switching operations are performed. Each of the plurality of switching elements may include a chalcogenide material with specific Si content. Values of the Vth distribution at the Si content of 0 at %, 3.7 at %, 5.0 at %, 5.4 at %, 6.5 at %, and 7.0 at % may be normalized by a value of the Vth distribution at the Si content of 0 at %. In order to improve the device characteristics, it may be desirable to decrease the degree of the Vth change.

Referring to FIGS. 5 and 6, when the silicon (Si) content is excessively large, for example, the silicon (Si) content exceeds 5.0 at %, the off current (Ioff) and the Vth distribution may be significantly deteriorated.

Figure 7:
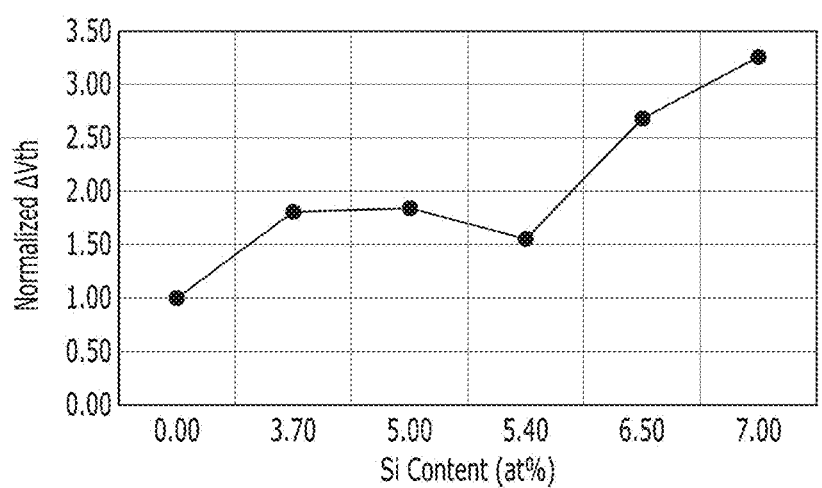
FIG. 7 illustrates a normalized Vth variation before and after evaluation of endurance according to Si content in a chalcogenide material in accordance with an implementation of the disclosed technology.

FIG. 7 illustrates a normalized threshold (Vth) variation before and after evaluation of endurance according to the Si content in a chalcogenide material in accordance with an implementation of the disclosed technology. In FIG. 7, the vertical axis represents a normalized value of a decreased amount of the Vth and the horizontal axis represents the Si content.

Endurance of a device may indicate an operating limit of the device according to an operation cycle. The endurance of the device may be expressed as the decreased amount of the Vth according to the cycle. For example, when a given number of operations for evaluation of endurance are performed on a selection element including the chalcogenide material, a threshold voltage of the selection element may be decreased compared to an initial threshold voltage of the selection element. A value of the normalized Vth variation in FIG. 7 may be obtained by calculating a difference between the initial threshold voltage and the threshold voltage after the given number of operations for evaluation of endurance have been performed, and then normalizing the calculated difference. In order to improve the device characteristics, it may be desirable to reduce the decreased amount of the Vth.

Referring to FIG. 7, it can be found that, if the chalcogenide material includes silicon (Si), the decreased amount of the Vth according to the cycle may be increased. When the silicon (Si) content is excessively large, for example, the silicon (Si) content exceeds 5.0 at %, the decreased amount of the Vth according to the cycle becomes equal to or greater than a given value (e.g., 1.25 in FIG. 7), thereby causing deterioration of the endurance.

In the above-described implementations of the disclosed technology, the silicon (Si) content in the chalcogenide material may be selected so as to balance overall factors affecting the device characteristics and result in the optimum effect in consideration of not only inhibiting the voltage drift acceleration (see, FIGS. 1 and 2) but also deterioration of other device characteristics (see, FIGS. 3 to 7).

In implementations of the disclosed technology, the silicon (Si) content may be 0.1-5 at %, or 0.5-4 at %. When the silicon (Si) content in a chalcogenide material is less than 0.1 at %, the Vth change according to a device delay time (e.g., the device delay time in FIG. 1) may be nonlinearly and significantly increased so that the voltage drift may be accelerated. When the silicon (Si) content in the chalcogenide material is greater than 5 at %, deterioration of other device characteristics (e.g., an increase in a difference between the VFF and the Vth, a decrease in Vth stability, an increase in the Ioff, deterioration of the endurance, and an increase in the Vth distribution) may occur.

Germanium (Ge) included in the chalcogenide material may affect thermal stability of the device. Further, Germanium (Ge) may control the voltage drift by substantially suppressing acceleration of the Vth increase, especially at the device delay time of 100 ms or less.

In implementations of the disclosed technology, the germanium (Ge) content in a chalcogenide material may be 15-22 at %, or 17-20 at %. When the germanium (Ge) content is less than 15 at %, the silicon (Si) content may be increased, thereby causing deterioration of one or more device characteristics such as an increase in a difference between the VFF and the Vth, a decrease in Vth stability, an increase in the Ioff, deterioration of the endurance, an increase in the Vth distribution. When the germanium (Ge) content is greater than 22 at %, the thermal stability of the device may be increased, but a value of the voltage drift may be relatively large.

Arsenic (As) included in the chalcogenide material may contribute to forming an amorphous structure of the chalcogenide material.

In implementations of the disclosed technology, the arsenic (As) content may be 30-35 at %, or 31-34 at %. When the arsenic (As) content is less than 30 at %, a switching operation of a device including the chalcogenide material may become unstable. When the arsenic (As) content is greater than 35 at %, content of each of other constituent elements may become relatively low due to the excessive arsenic (As) content, thereby resulting in deterioration of the device characteristics.

Selenium (Se) included in the chalcogenide material may have an influence on a band gap energy of the device to control a sneak current. Also, selenium (Se) may affect the voltage determination. As the band gap energy is increased, the off current (Ioff) may be decreased, thereby reducing the sneak current.

In implementations of the disclosed technology, the selenium (Se) content may be 40-50 at %, or 43-48 at %. When the selenium (Se) content is less than 40 at %, the device may not function properly due to the excessively low voltage. When the selenium (Se) content is greater than 50 at %, a decrease rate of the Vth according to the cycle is increased, thereby deteriorating the endurance.

The chalcogenide material in accordance with the above-described implementations may include silicon (Si), germanium (Ge), arsenic (As), and selenium (Se) as constituent elements, wherein the content of each constituent element may be selected to exhibit the optimum effect in consideration of the overall characteristics of the device. For example, the silicon (Si) content may be selected to substantially inhibit the voltage drift acceleration and reduce deterioration of other device characteristics.

The chalcogenide material may be prepared by various methods such as physical vapor deposition (PVD), chemical vapor deposition (CVD), atomic layer deposition (ALD), ion implantation, and the like.

In an implementation, a Si—Ge—As—Se chalcogenide material may be formed through a physical deposition process by using a SiGeAsSe alloy target, for example, a sputtering process.

In another implementation, a Si—Ge—As—Se chalcogenide material may be formed through a physical deposition process by using a Si target and a GeAsSe alloy target, for example, a co-sputtering process.

In further another implementation, a Si—Ge—As—Se chalcogenide material may be formed by incorporating Si into a Ge—As—Se material using a sputtering process, an ion implantation process, or both.

In still another implementation, a Si—Ge—As—Se chalcogenide material may be formed by depositing a Si layer and a GeAsSe layer and performing a heat treatment to cause a reaction between the Si layer and the GeAsSe layer.

In still further another implementation, a Si—Ge—As—Se chalcogenide material may be formed by depositing a plurality of Si layers and a plurality of GeAsSe layers and performing a heat treatment to cause a reaction between the Si layers and the GeAsSe layers.

An element including a chalcogenide material in accordance with an implementation may function as a switching element according to types and composition of constituent elements. The switching element using the chalcogenide may include an ovonic memory switching (OMS) element and an ovonic threshold switching (OTS) element. For the OMS element, when a pulse is applied to the OMS element, the phase of a material is changed. When a pulse is applied to the OTS element, the electrical characteristic is changed from a nonconductor state to a conductor state in a single phase (usually an amorphous phase), and when the pulse is removed, it returns to its original nonconductor state. The OTS element may have a high resistance in response to a voltage less than a given threshold voltage (Vth). When a voltage greater than the Vth is applied, a current flows through the OTS element at a relatively low voltage that is substantially constant and the OTS element exhibits a low impedance. When the current through the OTS element becomes lower than a holding current, the OTS element returns to a high-impedance condition. This I-V characteristics of the OTS element may be substantially symmetrical.

Hereinafter, an electronic device including a switching element including the chalcogenide material in accordance with the above-described implementations will be explained.

Figure 8:
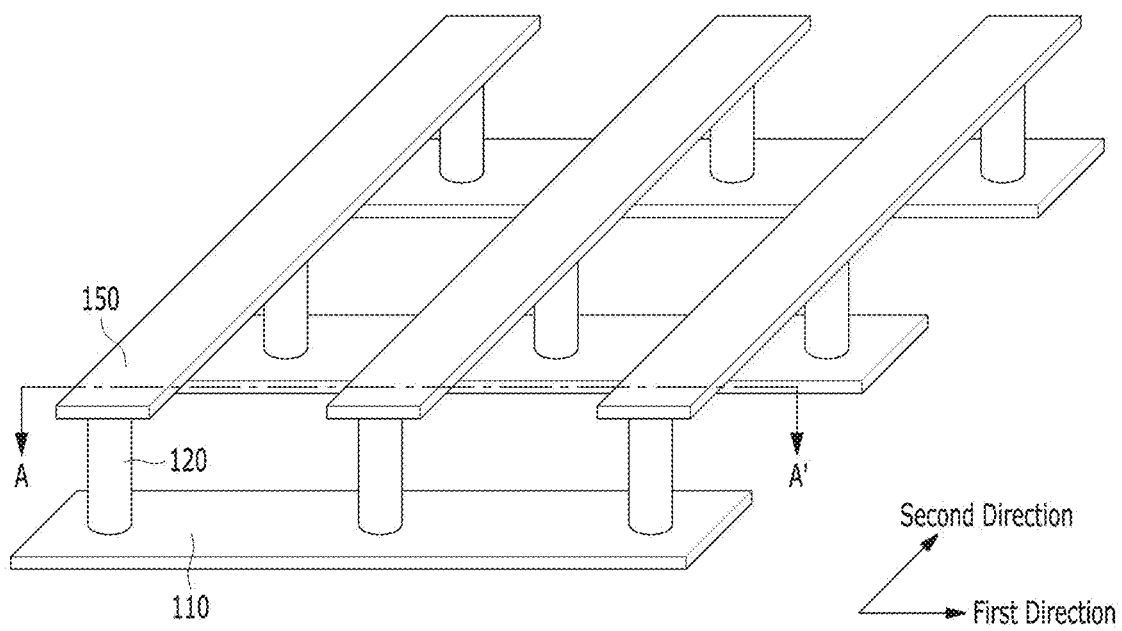
FIG. 8 is a perspective view of a semiconductor memory in accordance with an implementation of the disclosed technology.

FIG. 8 is a perspective view of a semiconductor memory in accordance with an implementation of the disclosed technology.

The semiconductor memory (or semiconductor memory device) in accordance with the implementation in FIG. 8 of the present disclosure may have a cross-point structure which includes first lines 110 each extending in a first direction, second lines 150 located over the first lines 110 and each extending in a second direction crossing the first direction, and memory cells 120 located between the first lines 110 and the second lines 150. The memory cells 120 are disposed at respective intersections of the first lines 110 and the second lines 150.

FIGS. 9A to 9D are cross-sectional views illustrating a semiconductor memory and a method for fabricating the semiconductor memory in accordance with an implementation of the disclosed technology.

Figure 9A:
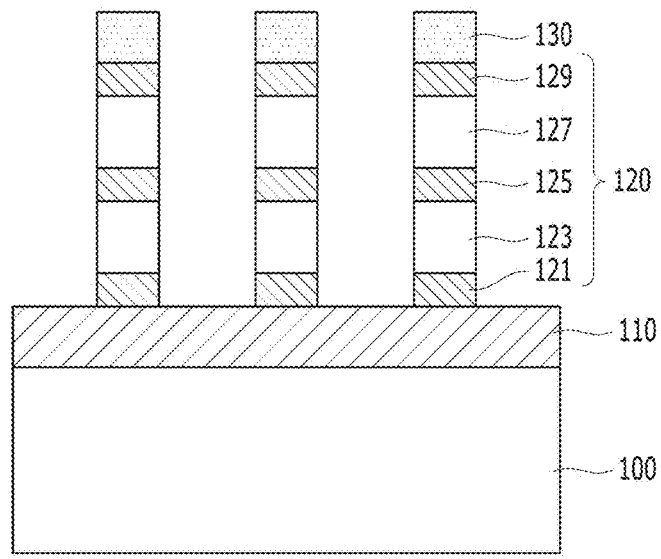
FIGS. 9A to 9D are cross-sectional views illustrating an exemplary semiconductor memory and a method for fabricating the same in accordance with an implementation of the disclosed technology.
Figure 9B:
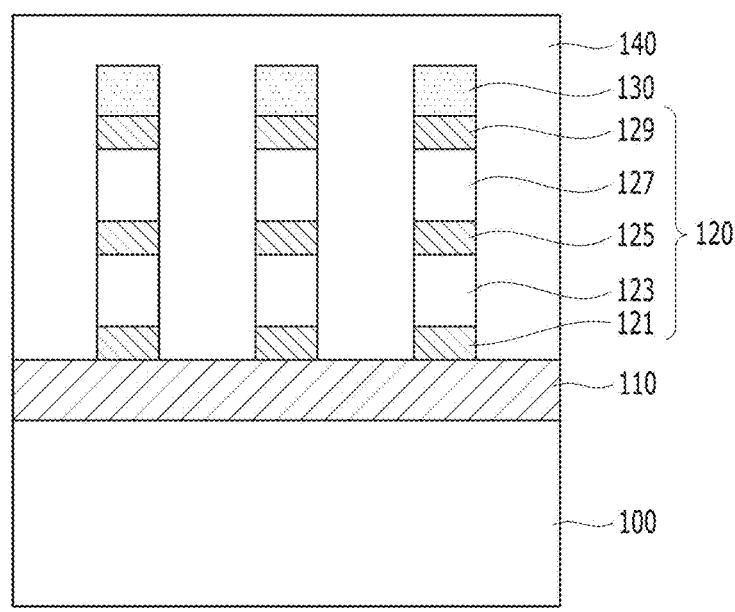
Figure 9C:
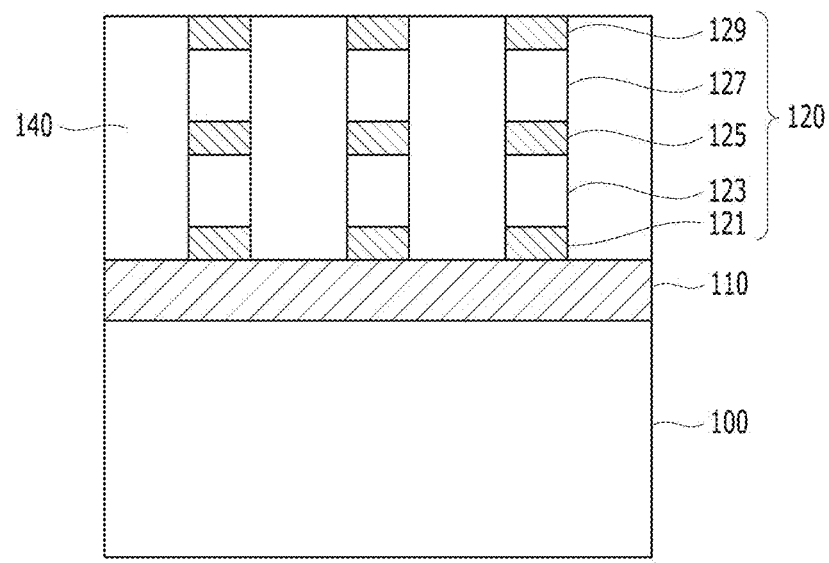
Figure 9D:
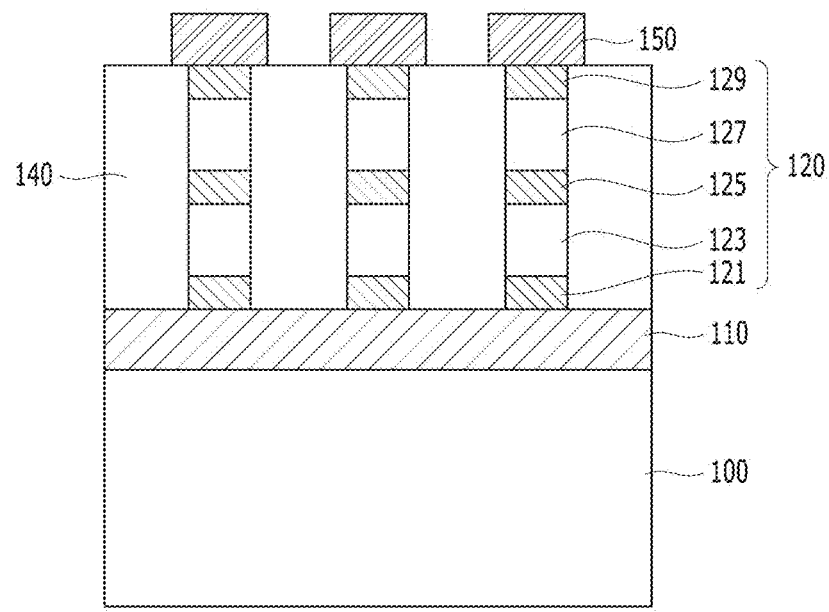

For example, FIG. 9D is a cross-sectional view of a portion of the semiconductor device taken along line A-A' of FIG. 8.

Referring to FIG. 9A, a substrate 100 including given structures (not shown) may be provided. For example, the given structures may include one or more transistors for controlling the first lines 110, the second lines 150, or the first and second lines 110 and 150 of FIGS. 8 and 9D, which are formed over the substrate 100.

Then, the first lines 110 each extending in a first direction (e.g., a horizontal direction in FIG. 9A) may be formed over the substrate 100. The first lines 110 may have a single-layered structure or a multi-layered structure, and may include a conductive material such as a metal, a metal nitride, etc. The first lines 110 may be formed by depositing a layer that includes the conductive material and patterning the deposited layer. Spaces between the first lines 110 may be filled with an insulating material (not shown).

Then, a plurality of memory cells 120 may be formed over the first lines 110. In the implementation shown in FIG. 9A, each of the plurality of memory cells 120 may have a pillar shape. The plurality of memory cells 120 may be arranged in a matrix having rows and columns. The rows each extend along the first direction and the columns each extend along a second direction crossing the first direction. The memory cells 120 may be disposed in respective intersection regions between the first lines 110 and second lines 150. An intersection region between one of the first lines 110 and one of the second lines 150 is defined, for example, as a three-dimensional region where the first line 110 and the second line 150 overlap each other in a third direction (e.g., a vertical direction in FIG. 9A) that crosses the first and second directions. In an implementation, each of the memory cells 120 may have a size that is substantially equal to or smaller than that of the intersection region between each corresponding pair of the first lines 110 and the second lines 150. In another implementation, each of the memory cells 120 may have a size that is larger than that of the intersection region between each corresponding pair of the first lines 110 and the second lines 150.

The memory cells 120 may be formed by depositing a plurality of material layers (not shown) over a structure including the first lines 110 and the insulating material (not shown), forming a plurality of hard mask patterns 130 over the plurality of material layers, and etching the material layers using the hard mask patterns 130 as an etching barrier. Therefore, each of the hard mask patterns 130 has sidewalls substantially aligned with sidewalls of each of the corresponding memory cells 120.

The hard mask patterns 130 may function as an etching barrier during etching the material layers (not shown) for forming the memory cells 120 and include one or more of various materials having etch selectivity with respect to the memory cells 120. For example, each of the hard mask patterns 130 may have a single-layered structure or a multi-layered structure and include an insulating material such as a silicon oxide, a silicon nitride, a silicon oxynitride, etc.

Also, in this implementation of FIG. 9A, each of the plurality of memory cells 120 may include a lower electrode layer 121, a selection element layer 123, a middle electrode layer 125, a variable resistance layer 127, and an upper electrode layer 129, which are sequentially stacked.

Specifically, the lower electrode layer 121 may be located at a lowermost portion of each of the memory cells 120 and function as a transmission path of a voltage or a current between a corresponding one of the first lines 110 and the remaining portion (e.g., the elements 123, 125, 127, and 129) of each of the memory cells 120. The middle electrode layer 125 may physically separate the selection element layer 123 from the variable resistance layer 127, and electrically couple the selection element layer 123 to the variable resistance layer 127. For example, a current flow through the selection element layer 123, the middle electrode layer 125, and the variable resistance layer 127, when a voltage level across the selection element layer 123 is equal to or greater than a given threshold voltage. The upper electrode layer 129 may be located at an uppermost portion of each of the memory cells 120 and function as a transmission path of a voltage or a current between a corresponding one of the second lines 150 of FIG. 9D and the remaining portion (e.g., the elements 121, 123, 125, and 127) of each of the memory cells 120. Each of the lower electrode layer 121, the middle electrode layer 125, and the upper electrode layer 129 may have a single-layered structure or a multi-layered structure and include a conductive material such as a metal, a metal nitride, a conductive carbon material, etc.

The selection element layer 123 may control access to the variable resistance layer 127. That is, the selection element layer 123 may function as a switching element and have a selection element characteristic, which substantially prevents a current from passing through the selection element layer 123 when a magnitude of an applied voltage or an applied current is lower than a critical value (or a threshold value), and causes a current to pass through the selection element layer 123 when a magnitude of the applied voltage or the applied current is substantially equal to or greater than the critical value. For example, a magnitude of the current passing through the selection element layer 123 is proportional to a magnitude of the voltage or current applied to the selection element layer 123. The selection element layer 123 may have a single-layered structure, or a multi-layered structure that exhibits the selection element characteristic using a combination of two or more layers.

For example, the selection element layer 123 may include the chalcogenide material in accordance with the above-described implementations. Specifically, in an implementation of the disclosed technology, the selection element layer 123 may include a chalcogenide material including 0.1-5 at % of silicon (Si), 15-22 at % of germanium (Ge), 30-35 at % of arsenic (As), and 40-50 at % of selenium (Se). Moreover, in an implementation of the disclosed technology, the selection element layer 123 may include a chalcogenide material including 0.5-4 at % of silicon (Si), 17-20 at % of germanium (Ge), 31-34 at % of arsenic (As), and 43-48 at % of selenium (Se). Further, in an implementation of the disclosed technology, the selection element layer 123 may include a chalcogenide material including about 2.0 at % of silicon (Si), about 18.0 at % of germanium (Ge), about 32.0 at % of arsenic (As), and about 48.0 at % of selenium (Se). Such a chalcogenide material has been explained in detail in the above-described implementations, the detailed explanation for the chalcogenide material is omitted for the interest of brevity.

As described above, the chalcogenide material included in the selection element layer 123 may include silicon (Si), germanium (Ge), arsenic (As), and selenium (Se) as constituent elements, wherein the content of each constituent element may be selected to exhibit the optimum effect in consideration of the overall characteristics of the device. For example, the silicon (Si) content may be selected to substantially inhibit the voltage drift acceleration and reduce deterioration of other device characteristics. Therefore, it is possible to effectively suppress the voltage drift acceleration at both of a relatively long delay time as well as a relatively short delay time and substantially prevent deterioration of other device characteristics, resulting in superior device characteristics and improved reliability of the device.

The variable resistance layer 127 may switch between different resistance states according to a voltage or a current applied to the variable resistance layer 127 through the upper electrode layer 129 and the middle electrode layer 125, thereby storing data having different values. For example, when the variable resistance layer 127 is in a low resistance state, data having a first logic value of '1' may be stored in the variable resistance layer 127. On the other hand, when the variable resistance layer 127 is in a high resistance state, data having a second logic value of '0' may be stored in the variable resistance layer 127. The variable resistance layer 127 may include one or more of various materials that are used in RRAM, PRAM, FRAM, MRAM, or the like. For example, the variable resistance layer 127 may include any of metal oxides, such as transition metal oxides or perovskite-based materials; phase-change materials, such as chalcogenide-based materials; ferroelectric materials, ferromagnetic materials; and the like. The variable resistance layer 127 may have a single-layered structure, or a multi-layered structure that shows a variable resistance characteristic by a combination of two or more layers. However, other implementations are also possible. For example, the memory cells 120 may include a memory layer, which can store data in different ways from the above-described variable resistance layer 127.

In the implementation shown in FIG. 9A, each of the memory cells 120 includes the lower electrode layer 121, the selection element layer 123, the middle electrode layer 125, the variable resistance layer 127, and the upper electrode layer 129. However, implementations of the present patent document are not limited thereto, and the memory cells 120 may have various structures. In some implementations, one or more of the lower electrode layer 121, the middle electrode layer 125, and the upper electrode layer 129 may be omitted. In some implementations, the stacked order of the selection element layer 123 and the variable resistance layer 127 may be reversed with respect to the orientation shown in FIG. 9A, such that the selection element layer 123 may be disposed over the variable resistance layer 127. In some implementations, in addition to the layers 121, 123, 125, 127, and 129 shown in FIG. 9A, the memory cells 120 may further include one or more layers (not shown) for enhancing characteristics of the memory cells 120, improving fabricating processes, or both.

A neighboring pair of the plurality of memory cells 120 may be spaced apart from each other at a given interval, and trenches may be present between the plurality of memory cells 120. In an implementation, the given interval is a predetermined interval, and a trench between a neighboring pair of the plurality of memory cells 120 may have a height to width ratio (or an aspect ratio) in a range from 1:1 to 40:1, from 10:1 to 40:1, from 10:1 to 20:1, from 5:1 to 10:1, from 10:1 to 15:1, from 1:1 to 25:1, from 1:1 to 30:1, from 1:1 to 35:1, or from 1:1 to 45:1.

In some implementations, the trench may have sidewalls that are substantially perpendicular to an upper surface of the substrate 100. In some implementations, neighboring trenches may be spaced apart from each other by substantially the same distance. For example, a first pair of trenches neighboring each other in a first direction (e.g., the first direction of FIG. 8) may be spaced apart from each other by substantially the same distance as a second pair of trenches neighboring each other in a second direction (e.g., the second direction of FIG. 8). In some implementations, distances between the neighboring trenches may vary.

Referring to FIG. 9B, an interlayer dielectric layer 140 may be formed over the structure illustrated in FIG. 9A. The interlayer dielectric layer 140 may include various insulating materials such as a silicon oxide, a silicon nitride, a silicon oxynitride, and the like. Moreover, the interlayer dielectric layer 140 may be formed along a lower profile. For example, the interlayer dielectric layer 140 is formed over the first lines 110, sidewalls of the memory cells 120, and upper surfaces and sidewalls of the hard mask patterns 130.

Referring to FIG. 9C, a planarization process may be performed on the interlayer dielectric layer 140 until the upper electrode 129 is exposed. The planarization process may be performed by a chemical mechanical polishing (CMP) process, an etch process, a cleaning process, or any suitable planarization process. Since the planarization process is performed until upper surfaces of the upper electrode layers 129 of the memory cells 120 are exposed, the hard mask pattern 130 may be removed by the planarization process.

Referring to FIG. 9D, a plurality of second lines 150 may be formed over the memory cells 120 and the interlayer dielectric layer 140. The plurality of second lines 150 may be respectively coupled to the upper surfaces of the memory cells 120. Each of the plurality of second lines 150 extends in the second direction crossing the first direction. For example, the second direction may be perpendicular to the line A-A' of FIG. 8. Each of the second lines 150 may have a single-layer structure or a multi-layer structure, and include a conductive material, such as any of a metal, a metal nitride, and the like. The second lines 150 may be formed by depositing a conductive material and patterning the deposited material. Spaces between neighboring second lines 150 may be filled with an insulating material (not shown).

Through the processes as described above, the semiconductor memory shown in FIG. 9D may be fabricated.

In the implementation shown in FIG. 9D, the semiconductor memory may include the memory cells 120 disposed at intersection regions between the first lines 110 each extending in the first direction and the second lines 150 each extending in the second direction. In an implementation, the selection element layer 123 of each of the memory cells 120 may include a chalcogenide material including 0.1-5 at % of silicon (Si), 15-22 at % of germanium (Ge), 30-35 at % of arsenic (As), and 40-50 at % of selenium (Se). In an implementation, the selection element layer 123 of each of the memory cells 120 may include a chalcogenide material including 0.5-4 at % of silicon (Si), 17-20 at % of germanium (Ge), 31-34 at % of arsenic (As), and 43-48 at % of selenium (Se).

The memory cells 120 may store data having different values according to a voltage or current that is applied thereto through the first lines 110 and the second lines 150. In particular, when the memory cells 120 each include variable resistance elements, each of the memory cells 120 may store data by switching between different resistance states.

One or more of the first lines 110 each may function as a word line and one more of the second lines 150 each may function as a bit line, and vice versa.

In the semiconductor memory of FIG. 9D fabricated by a method according to an implementation of the present disclosure, the selection element layer 123 of the memory cells 120 includes the chalcogenide material having specific composition of four components so that the optimum effects can be exhibited in terms of various aspects of device characteristics such as voltage drift, a Vth, a VFF, an Ioff, Vth distribution, endurance, and the like.

Figure 10:
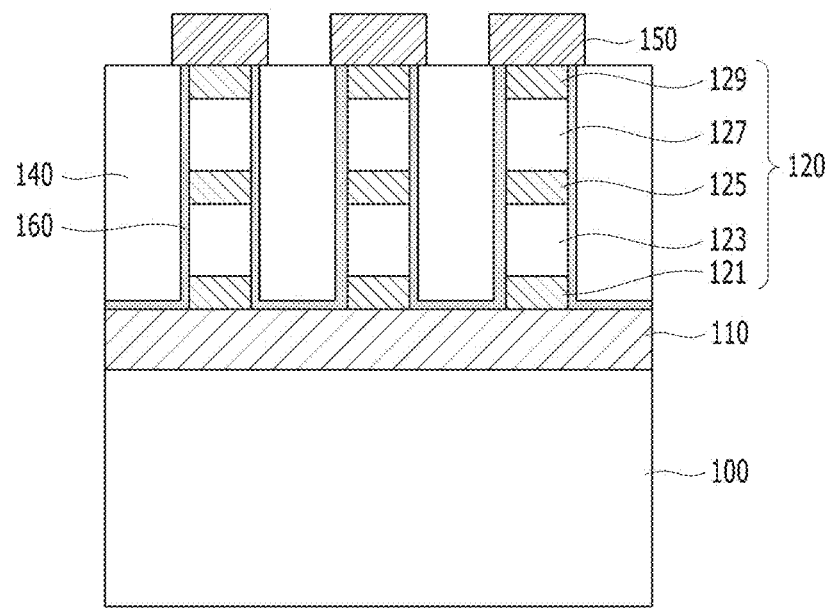
FIG. 10 is a cross-sectional view illustrating a semiconductor memory in accordance with an implementation of the disclosed technology.

FIG. 10 is a cross-sectional view illustrating a semiconductor memory in accordance with an implementation of the disclosed technology. Detailed descriptions of parts that are substantially the same as those of the implementation described above with reference to FIGS. 9A to 9D will be omitted for the interest of brevity.

Referring to FIG. 10, a capping layer 160 may be further formed on sidewalls of the memory cells 120 and over the first lines 110. The capping layer 160 may function to protect the memory cells 120, and have a single-layered structure or a multi-layered structure including various insulating materials such as a silicon nitride and the like.

The capping layer 160 may be formed by forming a material layer for the capping layer 160 over the structure of FIG. 9A, for example, on sidewalls of the memory cells 120 and sidewalls and upper surfaces of the hard mask pattern 130 and performing the processes of FIGS. 9B to 9D.

As a result, the first lines 110 each extending in a first direction (e.g., the first direction of FIG. 8) and the second lines 150 each extending in a second direction (e.g., the second direction of FIG. 8) are formed over the substrate 100 and the memory cells 120 may be disposed in respective intersection regions between the first lines 110 and the second lines 150. In an implementation, the selection element layer 123 of each of the memory cells 120 may include the chalcogenide material including 0.1-5 at % of silicon (Si), 15-22 at % of germanium (Ge), 30-35 at % of arsenic (As), and 40-50 at % of selenium (Se). In an implementation, the selection element layer 123 of each of the memory cells 120 may include a chalcogenide material including 0.5-4 at % of silicon (Si), 17-20 at % of germanium (Ge), 31-34 at % of arsenic (As), and 43-48 at % of selenium (Se).

The sidewalls of the memory cells 120 may be in direct contact with the capping layer 160. The capping layer 160 may include an insulating material and function to protect the memory cells 120.

In the implementations shown in FIGS. 8 to 10, the semiconductor memory having a single-layer cross-point structure has been described. However, in another implementation, a semiconductor memory may have a multi-layer cross-point structure in which two or more cross-point structures may be stacked. Each of the cross-point structures may include first lines 110, second lines 150, and memory cells 120 located at respective intersections between the first lines 110 and the second lines 150.

Memory circuits or semiconductor devices in accordance with implementations based on the disclosed technology can be used in a range of devices or systems. FIGS. 11 to 15 provide some examples of devices or systems that can implement the memory circuits disclosed herein.

Figure 11:
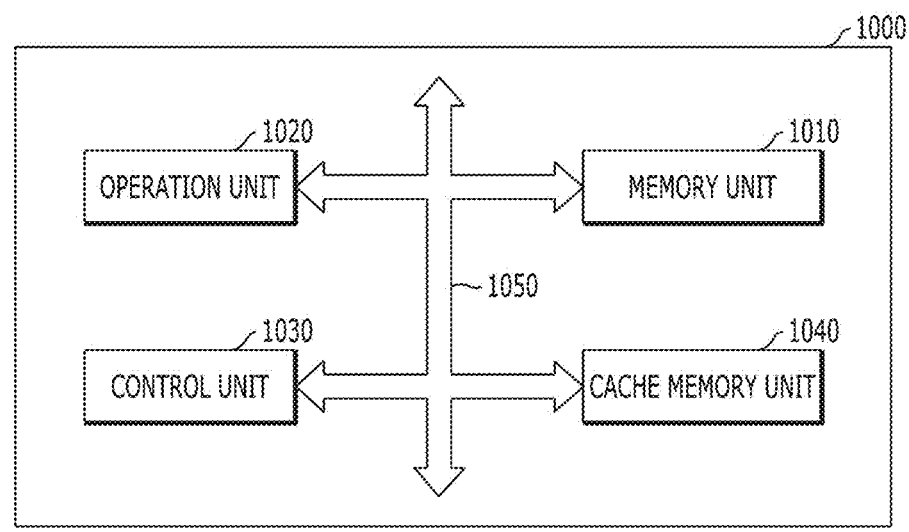
FIG. 11 is an example of configuration diagram of a microprocessor implementing memory circuitry based on an implementation of the disclosed technology.

FIG. 11 is an example of configuration diagram of a microprocessor implementing memory circuitry based on the disclosed technology.

Referring to FIG. 11, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of memory cells each including a switching element, wherein the switching element includes a chalcogenide material including 0.1-5 atomic percent (at %) of silicon, 15-22 at % of germanium, 30-35 at % of arsenic and 40-50 at % of selenium. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 12:
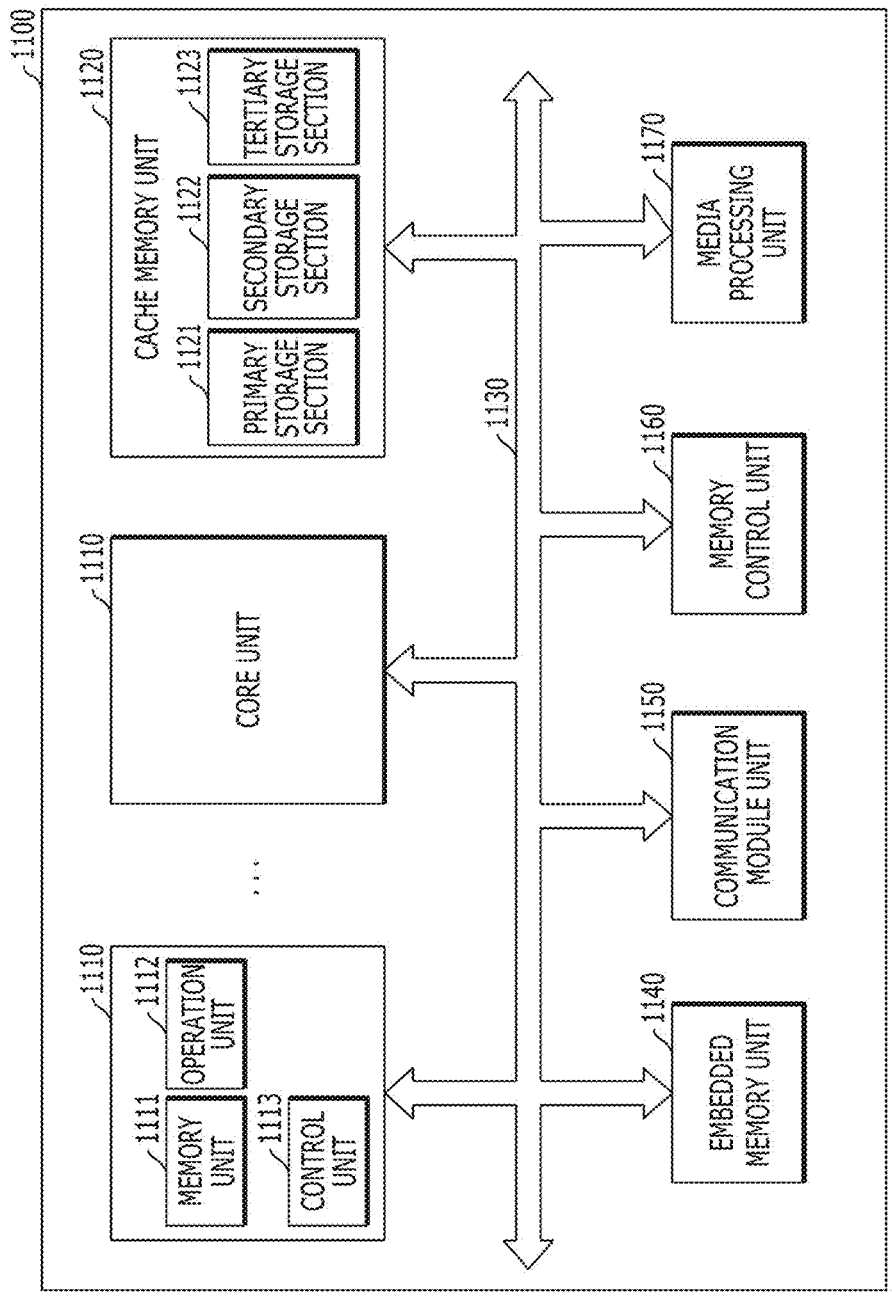
FIG. 12 is an example of configuration diagram of a processor implementing memory circuitry based on an implementation of the disclosed technology.

FIG. 12 is an example of configuration diagram of a processor implementing memory circuitry based on an implementation of the disclosed technology.

Referring to FIG. 12, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of memory cells each including a switching element, wherein the switching element includes a chalcogenide material including 0.1-5 atomic percent (at %) of silicon, 15-22 at % of germanium, 30-35 at % of arsenic and 40-50 at % of selenium. Through this, data storage characteristics of the cache memory unit 1120 may be improved. As a consequence, operating characteristics of the processor 1100 may be improved.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130.

The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard.

The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 13:
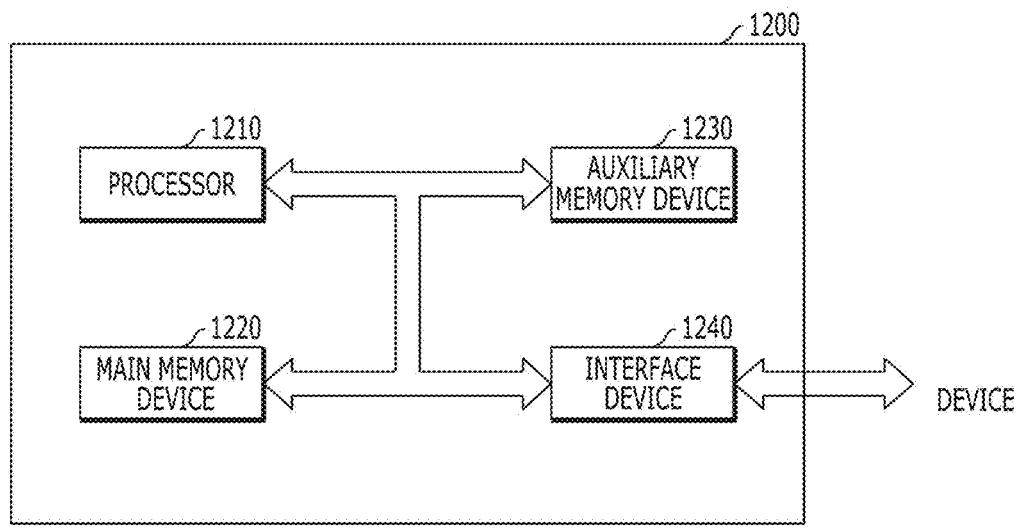
FIG. 13 is an example of configuration diagram of a system implementing memory circuitry based on an implementation of the disclosed technology.

FIG. 13 is an example of configuration diagram of a system implementing memory circuitry based on an implementation of the disclosed technology.

Referring to FIG. 13, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include a plurality of memory cells each including a switching element, wherein the switching element includes a chalcogenide material including 0.1-5 atomic percent (at %) of silicon, 15-22 at % of germanium, 30-35 at % of arsenic and 40-50 at % of selenium. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of memory cells each including a switching element, wherein the switching element includes a chalcogenide material including 0.1-5 atomic percent (at %) of silicon, 15-22 at % of germanium, 30-35 at % of arsenic and 40-50 at % of selenium. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 14) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 14:
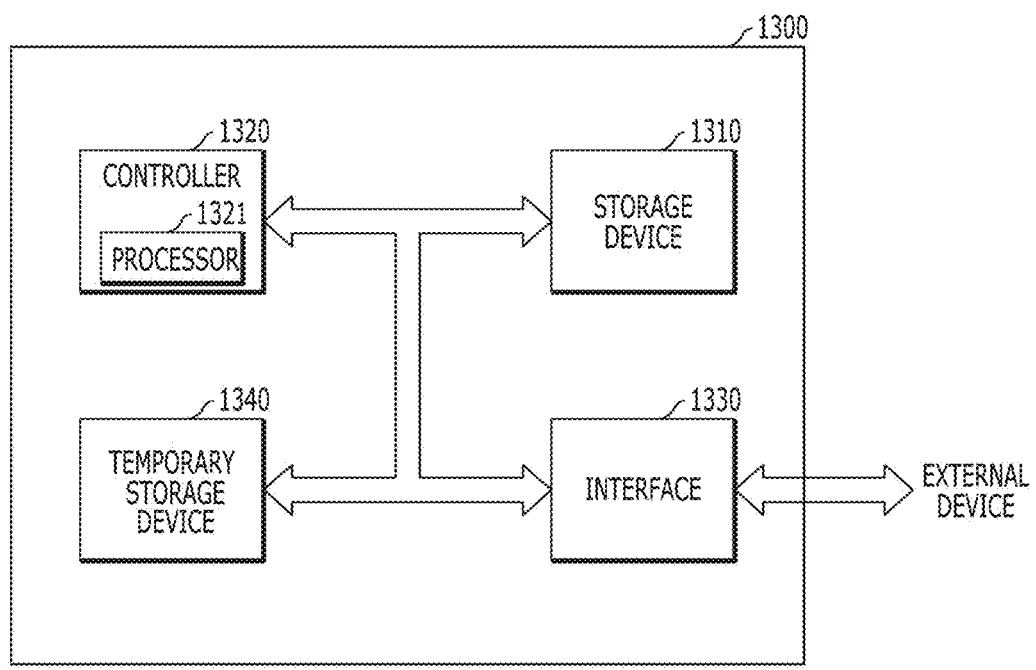
FIG. 14 is an example of configuration diagram of a data storage system implementing memory circuitry based on an implementation of the disclosed technology.

FIG. 14 is an example of configuration diagram of a data storage system implementing memory circuitry based on an implementation of the disclosed technology.

Referring to FIG. 14, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of memory cells each including a switching element, wherein the switching element includes a chalcogenide material including 0.1-5 atomic percent (at %) of silicon, 15-22 at % of germanium, 30-35 at % of arsenic and 40-50 at % of selenium. Through this, data storage characteristics of the storage device 1310 or the temporary storage device 1340 may be improved. As a result, operating characteristics and data storage characteristics of the data storage system 1300 may be improved.

Figure 15:
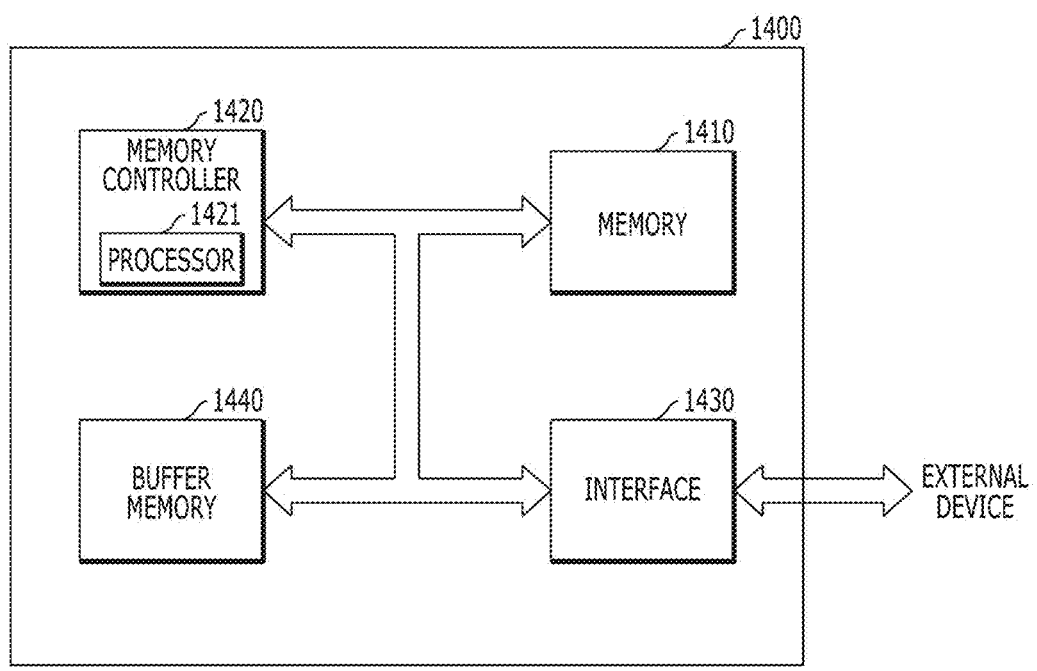
FIG. 15 is an example of configuration diagram of a memory system implementing memory circuitry based on an implementation of the disclosed technology.

FIG. 15 is an example of configuration diagram of a memory system implementing memory circuitry based on an implementation of the disclosed technology.

Referring to FIG. 15, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of memory cells each including a switching element, wherein the switching element includes a chalcogenide material including 0.1-5 atomic percent (at %) of silicon, 15-22 at % of germanium, 30-35 at % of arsenic and 40-50 at % of selenium. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of memory cells each including a switching element, wherein the switching element includes a chalcogenide material including 0.1-5 atomic percent (at %) of silicon, 15-22 at % of germanium, 30-35 at % of arsenic and 40-50 at % of selenium. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 11-15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A chalcogenide material comprising 0.1-5 atomic percent (at %) of silicon, 15-22 at % of germanium, 30-35 at % of arsenic, and 40-50 at % of selenium.

2. The chalcogenide material of claim 1, wherein content of silicon is 0.5-4 at %.

3. The chalcogenide material of claim 1, wherein content of germanium is 17-20 at %.

4. The chalcogenide material of claim 1, wherein content of arsenic is 31-34 at %.

5. The chalcogenide material of claim 1, wherein content of selenium is 43-48 at %.

6. An electronic device comprising:
a switching element including a chalcogenide material, the chalcogenide material including 0.1-5 atomic percent (at %) of silicon, 15-22 at % of germanium, 30-35 at % of arsenic, and 40-50 at % of selenium;
a first electrode electrically coupled to the switching element; and
a second electrode electrically coupled to the switching element.

7. The electronic device of claim 6, wherein content of silicon is 0.5-4 at %.

8. The electronic device of claim 6, wherein content of germanium is 17-20 at %.

9. The electronic device of claim 6, wherein content of arsenic is 31-34 at %.

10. The electronic device of claim 6, wherein content of selenium is 43-48 at %.

11. An electronic device comprising a semiconductor memory device, the semiconductor memory device including a first memory cell that includes a first switching element,
wherein the first switching element includes a chalcogenide material including 0.1-5 atomic percent (at %) of silicon, 15-22 at % of germanium, 30-35 at % of arsenic, and 40-50 at % of selenium.

12. The electronic device of claim 11, wherein the semiconductor memory device further includes:
a second memory cell including a second switching element, the second switching element having a chalcogenide material including 0.1-5 atomic percent (at %) of silicon, 15-22 at % of germanium, 30-35 at % of arsenic, and 40-50 at % of selenium, and
wherein the first memory cell and the second memory cell further include a first memory layer and a second memory layer, respectively, each of the first and second memory layers switching between different resistance states according to a voltage or a current applied thereto.

13. The electronic device of claim 12, wherein the first switching element and the second switching element control access to the first memory layer and the second memory layer, respectively.

14. The electronic device of claim 11, wherein the semiconductor memory device includes a plurality of memory cells including the first memory cell,
wherein the semiconductor memory device further includes:
a plurality of first lines disposed between a substrate and the plurality of memory cells, each of the plurality of first lines extending in a first direction; and
a plurality of second lines disposed over the plurality of memory cells, each of the plurality of second lines extending in a second direction that crosses the first direction, and
wherein the plurality of memory cells are disposed at respective intersections of the first lines and the second lines.

15. The electronic device of claim 11, wherein the semiconductor memory device further includes a capping layer disposed over at least side surfaces of the first memory cell.

16. The electronic device of claim 11, content of silicon is 0.5-4 at %.

17. The electronic device of claim 11, wherein content of germanium is 17-20 at %.

18. The electronic device of claim 11, wherein content of arsenic is 31-34 at %.

19. The electronic device of claim 11, wherein content of selenium is 43-48 at %.

20. The electronic device according to claim 11, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

* * * * *